(12) United States Patent
Lin et al.

(10) Patent No.: US 7,078,930 B2
(45) Date of Patent: Jul. 18, 2006

(54) INTEGRATED CIRCUIT CHIP WITH HIGH AREA UTILIZATION RATE

(75) Inventors: Tin-Hao Lin, Hsin-Chu (TW); Chia-Nan Hong, Hsin-Chu (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 10/907,608

(22) Filed: Apr. 7, 2005

(65) Prior Publication Data
US 2006/0071685 A1    Apr. 6, 2006

(30) Foreign Application Priority Data
Oct. 5, 2004    (TW) ................ 93130141 A

(51) Int. Cl.
*H03K 19/00*    (2006.01)
(52) U.S. Cl. .................. 326/16; 326/101; 326/47; 257/48; 438/18
(58) Field of Classification Search ................ 326/16, 326/41, 101, 47; 257/48; 438/11, 18
See application file for complete search history.

(56) References Cited

U.S. PATENT DOCUMENTS 5,944,813 A * 8/1999 Trimberger ............... 712/36
6,452,208 B1 * 9/2002 Susami ...................... 257/48

* cited by examiner

*Primary Examiner*—Daniel Chang
(74) *Attorney, Agent, or Firm*—Winston Hsu

(57) ABSTRACT

An integrated circuit chip with a high area utilization rate includes: a plurality of logic circuits in a logic area; a first input and output circuit near a first side of the logic area for exchanging signals with the logic circuit; a second input and output circuit near a second side of the logic area for exchanging signals with the logic circuit; a plurality of first probe pads coupled to the first and the second input and output circuits for inputting or outputting signals to the first and the second input and output circuits; a corner cell comprising a plurality of wires coupled to the first and the second input and output circuits for exchanging signals between the first and the second input and output circuits; and a first process monitor circuit formed in the corner cell for monitoring a semiconductor process of the integrated circuit chip.

5 Claims, 4 Drawing Sheets

INTEGRATED CIRCUIT CHIP WITH HIGH AREA UTILIZATION RATE

BACKGROUND OF INVENTION

1. Field of the Invention

The present invention provides an integrated circuit chip with a high area utilization rate, and more particularly, an integrated circuit chip with a process monitor circuit and probe pads of the process monitor circuit deposited in a corner cell of the integrated circuit chip.

2. Description of the Prior Art

With high developments of technology, integrated circuits (IC) have become the most important unit in electric products, such as personal computers, mobile phones, calculators, and even watches. Semiconductor technology attempts to integrate a multi-function system onto a chip, called an application specific integrated circuit, or ASIC, said system including microprocessors, analog/digital signal processors, memories, high-speed interfaces, and so on. Such complex circuits create many problems in testing and analysis.

The yield of an IC chip is affected by many factors. In order to determine whether the manufacturing process of the semiconductor affects the yield, a prior art process monitor circuit is utilized for monitoring some functions of the chip. Please refer to FIG. 1, which illustrates a schematic diagram of a prior art chip 10 capable of monitoring the functions of a chip after the manufacturing process of a semiconductor. To be concise, FIG. 1 illustrates only a corner of the chip 10. The chip 10 includes a substrate 12, a logic area 14, two input/output (or I/O) circuits 16, a corner cell 18, a plurality of probe pad areas 20, and an area for a process monitor circuit 24. For preventing damage during dicing, or skewed effect, transistors affecting the performance of the chip 10 are not allowed to be positioned in the corner cell 18. The corner cell 18 communicates with the neighboring I/O circuits 16 via a plurality of wires 19. The chip 10 receives signals from a system through a plurality of probe pads 22 in the probe pad areas 20, and transmits the signals to a plurality of logic circuits (not shown in FIG. 1) in the logic area 14 through the I/O circuits 16. After processing a series of operations, the logic circuits in the logic area 14 transmit results through the I/O circuits 16 and the probe pads 22 to the system. As shown in FIG. 1, in order to monitor whether operations of the chip 10 are incorrect owing to the manufacturing process of the semiconductor, a process monitor circuit 24 is set in the logic area 14 of the chip 10, and the process monitor circuit 24 outputs related results to a monitor system through probe pads 220 and 222 according to different user requirements. Therefore, with the results provided by the process monitor circuit 24, the monitor system can check if the yield of the chip 10 is related to the semiconductor manufacturing process. For example, the monitor system can determine whether semiconductor properties of the chip 10 conform to a specification, and whether a shift in a semiconductor property has decreased the yield.

Referring to FIG. 1, because the process monitor circuit 24 occupies a fixed area of the logic area 14, the area is reserved at design time in the logic area 14 for containing the process monitor circuit 24. Conventionally, there are two configurations for locating the process monitor circuit 24 in the logic area 14. One is to reserve an area with fixed size and form in the logic area 14 for containing the process monitor circuit 24. As a result, the design of the logic circuits in the logic area 14 needs to be based on the remaining area of the logic area 14, which increases complexity. Meanwhile, if the system requires process monitor circuits with different monitoring functions, the logic area 14 needs to reserve corresponding areas. A second configuration is to design the logic circuits of the process monitor circuit into the logic area 14 without reserving any specified area, and then to design the process monitor circuit 24 according to remaining areas of the logic circuits in the logic area 14. Obviously, an advantage of the second method is that when designing the logic circuits, the area of the process monitor circuit 24 is not a limitation. However, after the logic circuits are set in the logic area 14, the remaining area may not be large enough to contain the process monitor circuit 24, and moreover, the process monitor circuit 24 must be set taking the remaining area into consideration. Furthermore, if the system requires different process monitor circuits, the designs of the process monitor circuits can cost a significant amount of system resources. Therefore, the above-mentioned configurations of the process monitor circuit 24 must consider the logic circuits in the logic area 14, and most importantly, these configurations occupy a portion of the logic area 14, but "area" is very precious on an IC chip.

Furthermore, in FIG. 1, the probe pads 220 and 222 for the process monitor circuit 24 to transmit monitored results to the system also inevitably occupy parts of the substrate 12, so the available area for the probe pads 22 is reduced.

In summary, in order to monitor the chip 10, the prior art has to consider not only configurations and designs of the logic circuit and the process monitor circuit in the logic area, but also the space for the probe pads, which increases system resources, increases the cost of production, and wastes chip area.

SUMMARY OF INVENTION

It is therefore a primary objective of the claimed invention to provide an integrated circuit chip with a high area utilization rate.

According to the claimed invention, an integrated circuit chip with a high area utilization rate includes: a plurality of logic circuits in a logic area of the integrated circuit chip; a first input and output circuit near a first side of the logic area for exchanging signals with the logic circuit; a second input and output circuit near a second side of the logic area for exchanging signals with the logic circuit; a plurality of first probe pads coupled to the first and the second input and output circuits for inputting or outputting signals to the first and the second input and output circuits; a corner cell comprising a plurality of wires coupled to the first and the second input and output circuits for exchanging signals between the first and the second input and output circuits; and a first process monitor circuit formed in the corner cell for monitoring a semiconductor property of the integrated circuit chip.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
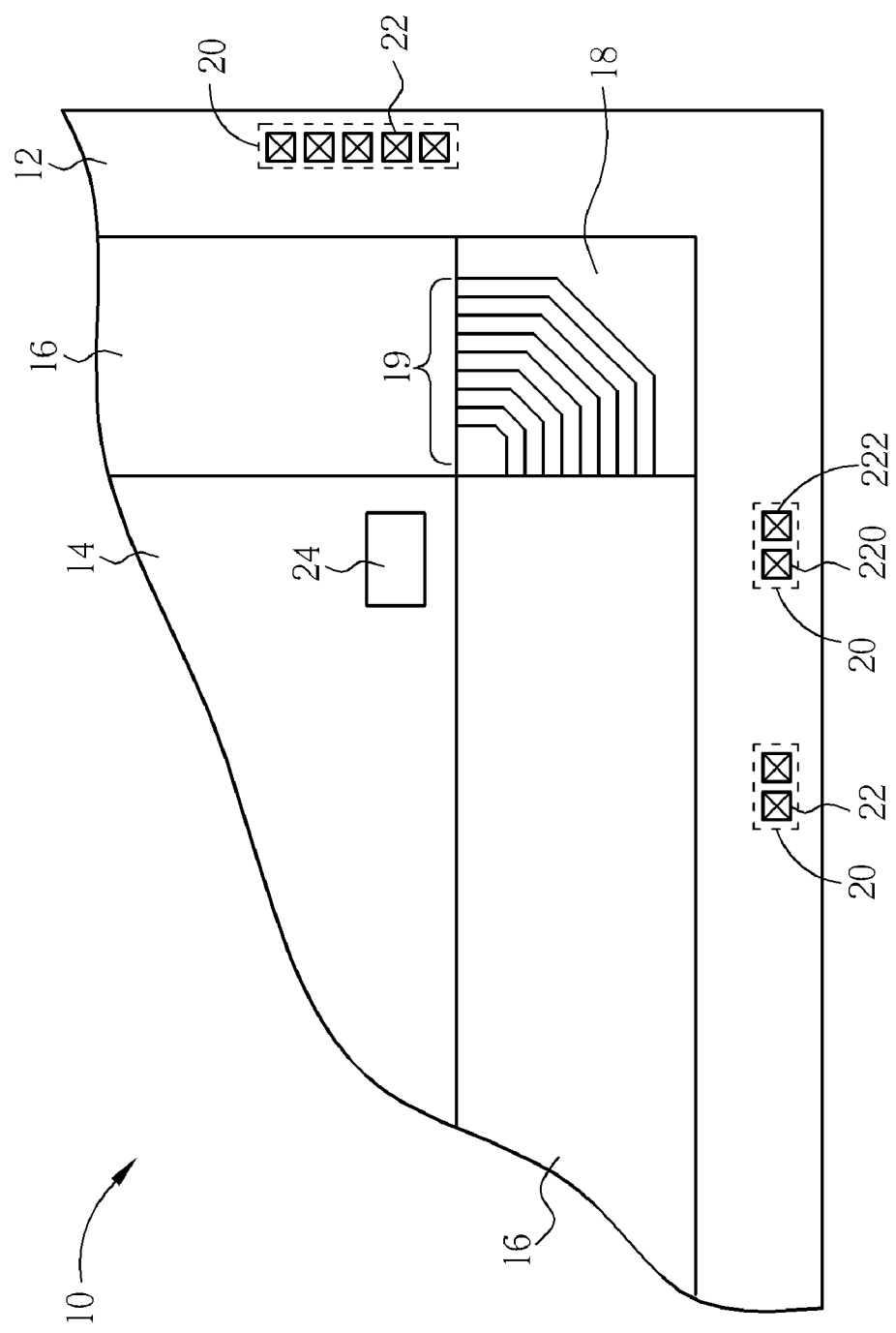
FIG. 1 illustrates a schematic diagram of a prior art chip.
Figure 2:
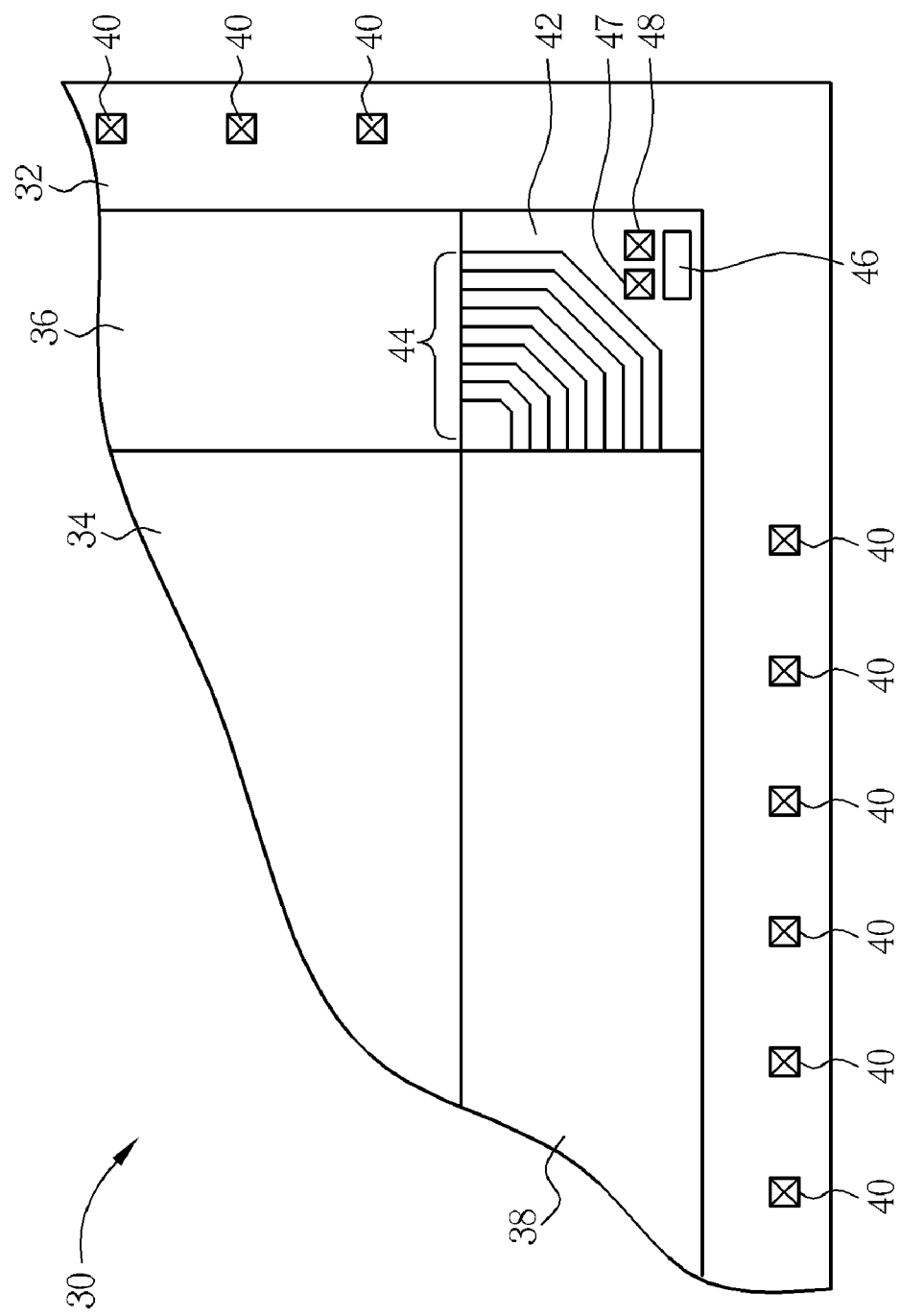
FIG. 2 illustrates a schematic diagram of a preferred embodiment integrated circuit chip with high area utilization rate in accordance with the present invention.

Please refer to FIG. 2, which illustrates a schematic diagram of a preferred embodiment integrated circuit chip 30 with high area utilization rate in accordance with the present invention. For conciseness, FIG. 2 illustrates only part of the IC chip 30. The IC chip 30 includes a substrate 32, a logic area 34, a first I/O circuit 36, a second I/O circuit 38, a plurality of probe pads 40, and a corner cell 42. Each component of the IC chip 30 is formed or grown on the substrate 32. The logic area 34 includes a plurality of logic circuits (not shown in FIG. 2) for performing operations of a system. The first I/O circuit 36 and the second I/O circuit 38 are deposited in a first side and a second side of the logic area 34, which are the right and the bottom in FIG. 2. The first I/O circuit 36 and the second I/O circuit 38 are used for inputting or outputting signals for the logic circuits in the logic area 34. The probe pads 40 transmit signals provided by a system to the I/O circuits 36 and 38, or transmits signals provided by the I/O circuits 36 and 38 to the system. The corner cell 42 includes a plurality of wires 44, a process monitor circuit 46, and probe pads 47 and 48. The wires 44 in the corner cell 42 exchange signals between the I/O circuit 36 and the I/O circuit 38. Therefore, the IC chip 30 receives signals provided by the system with the probe pads 40, and transmits signals to the logic circuit in the logic area 34 with the I/O circuits 36 and 38 (and possibly other I/O circuits not shown in FIG. 2). After performing necessary operations, the logic circuits in the logic area 34 transmit results to the system through the I/O circuits 36, 38 (and possibly other I/O circuits not shown in FIG. 2), and the probe pads 40. As shown in FIG. 2, in order to monitor whether the IC chip 30 is affected by the manufacturing process of the semiconductor, the present invention utilizes the process monitor circuit 46 in the corner cell 42 of the IC chip 30 for monitoring the IC chip 30 and returning corresponding results to a monitor system with the probe pads 47 and 48 according to a monitor condition. Therefore, with the monitoring results provided by the process monitor circuit 46, the monitor system determines whether the yield of the IC chip 30 correlates to the manufacturing process of the semiconductor. For example, the monitor system can determine whether characteristics of the IC chip 30 conform to a specification, and help to identify reasons if the yield is degraded.

As mentioned above, in order to prevent damage during dicing, or skewed effect, from affecting the IC chip 30, the corner cell 42 cannot include any transistors that affect the IC chip 30. However, the process monitor circuit 46 does not affect operations of the logic area 34 or the I/O circuits 36 and 38. The process monitor circuit 46 tests the IC chip 30 after a silicon wafer grows completely, and before the IC chip 30 is obtained by cutting the silicon wafer, so the process monitor circuit 46 is not affected by damage during dicing. Meanwhile, packaging of the probe pads 47 and 48 of the process monitor circuit 46 are unnecessary.

The present invention sets the process monitor circuit 46 and the probe pads 47 and 48 in the corner cell 42 to increase the available area of the logic area 34 and the probe pads 40. Moreover, in the present invention the corner cell 42 can be tailored to meet different monitor requirements. For example, an IC chip includes four corners, so the present invention can utilize four corner cells having different process monitor circuits in the four corners without modifying the logic circuits in the logic area or the process monitor circuits. Furthermore, by changing the corner cells, the present invention can change the process monitor circuits, thereby saving system resources.

Figure 3:
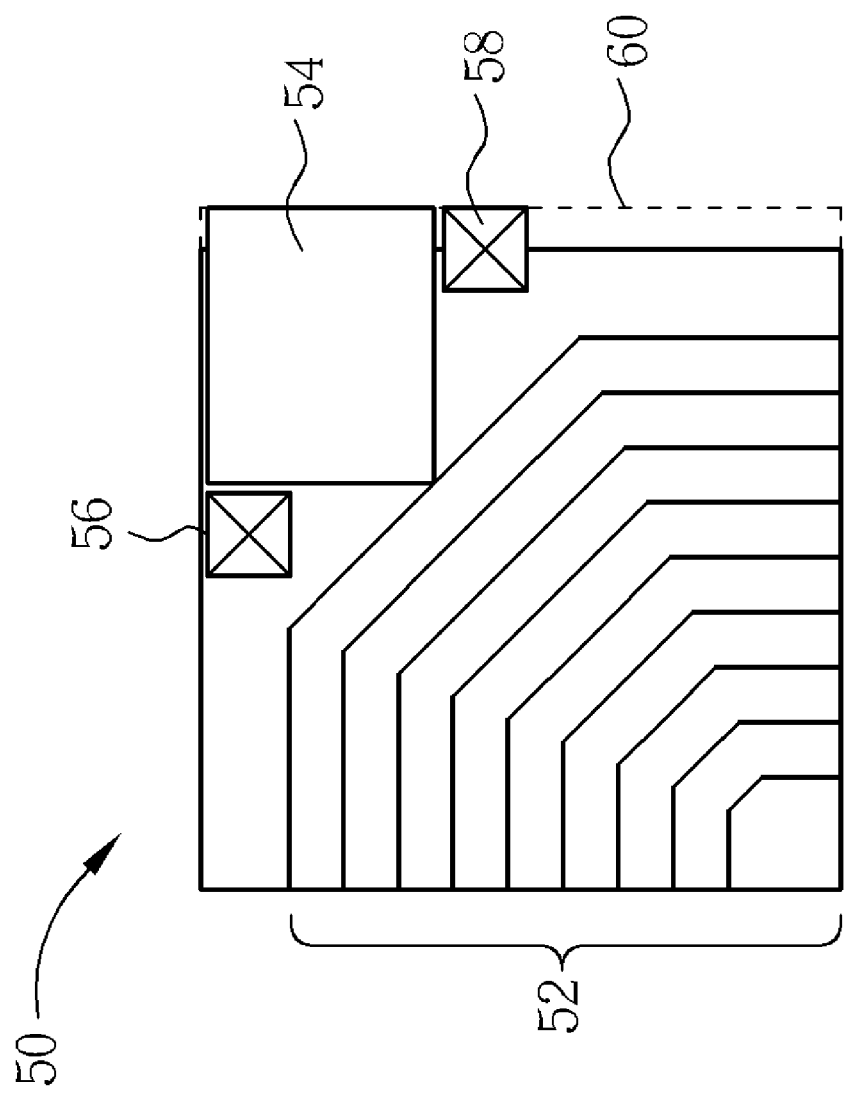
FIG. 3 illustrates a schematic diagram of a corner cell of an IC chip in FIG. 2.
Figure 4:
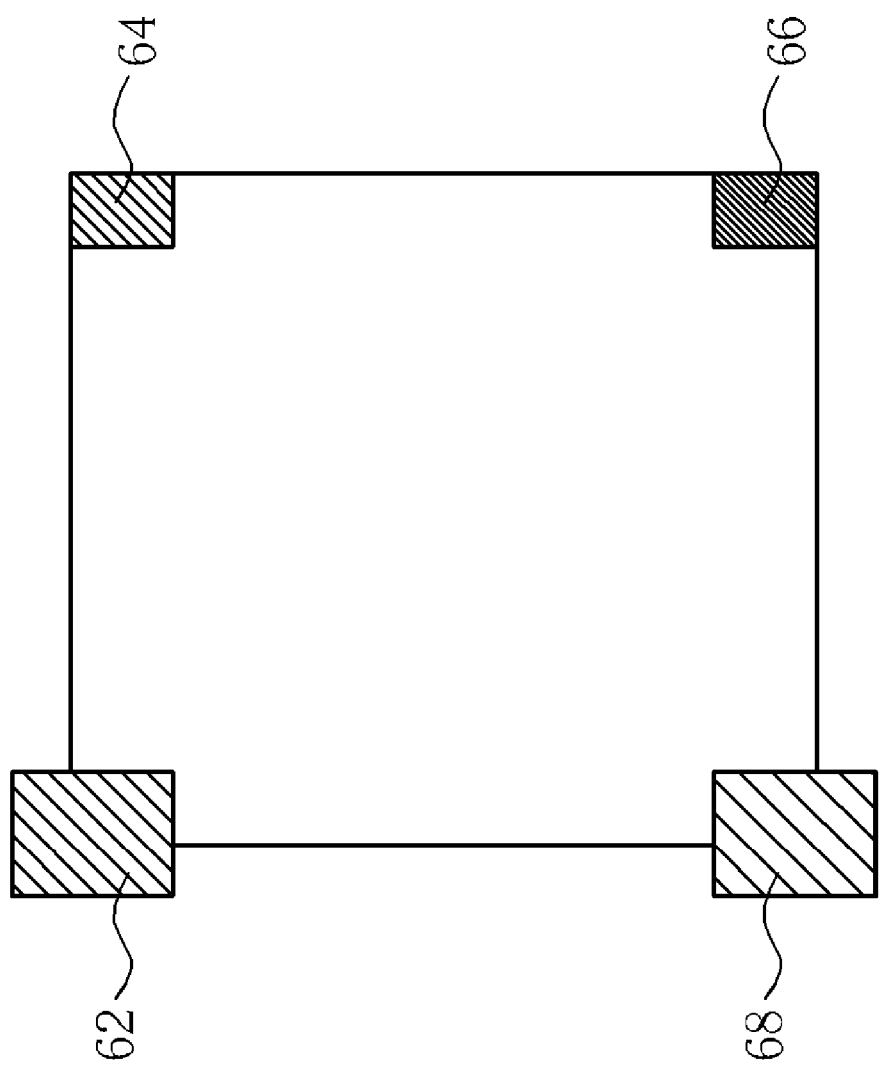
FIG. 4 illustrates a schematic diagram of an IC chip having four corner cells in accordance with the present invention.

In addition, considering a process monitor circuit with a large area, the present invention can meet the needs of such a process monitor circuit by modifying a size of a corner cell. For example, please refer to FIG. 3, which illustrates a schematic diagram of a corner cell 50 of the IC chip 30 in FIG. 2. The corner cell 50 includes a plurality of wires 52, a process monitor circuit 54, and probe pads 56 and 58 of the process monitor circuit 54. As shown in FIG. 3, the process monitor circuit 54 is larger than an initial size of the corner cell 50, so the present invention enlarges the corner cell 50 to the dotted line 60 to contain the process monitor circuit 54. That is, the present invention changes the corner cell to meet the needs of the larger process monitor circuit without changing the logic circuits in the logic area. Please refer to FIG. 4, which illustrates a schematic diagram of an IC chip having four corner cells 62, 64, 66 and 68 in accordance with the present invention. For conciseness, FIG. 4 only illustrates corresponding positions of the corner cell 62, 64, 66, 68 and the IC chip. As mentioned above, the corner cells can change their sizes according to the sizes of the process monitor circuits. Therefore, in FIG. 4, the corner cells 62 and 68 are made larger than a rectangular dicing would leave the original areas of the corner cells.

In addition, the probe pads of the process monitor circuit do not have to be contained in the corner cell, so the present invention can deposit the probe pads of the process monitor circuit outside the corner cell. On the other hand, for those process monitor circuits located in the IC chip, their probe pads can be set in the corner cell.

In summary, after a silicon wafer is complete, the process monitor circuit tests the IC chip, and then the silicon wafer is cut, so the process monitor circuit is not affected by dicing. Therefore, the present invention increases usable areas of the logic area by depositing the process monitor circuits and the probe pads of the process monitor circuits in the corner cell. As a result, when designing the logic circuits in the logic area of the IC chip, a designer does not have to preserve an area within the logic area for the process monitor circuit, which decreases complexity and reduces packaging requirements for the probe pads of the process monitor circuit. Moreover, the present invention can change different corner cells to meet different monitoring requirements, which decreases the overhead on system resources.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit chip with an improved area utilization rate comprising:
   a plurality of logic circuits in a logic area of the integrated circuit chip;
   a first input and output circuit near a first side of the logic area for exchanging signals with the logic circuit;
   a second input and output circuit near a second side of the logic area for exchanging signals with the logic circuit;
   a plurality of first probe pads coupled to the first and the second input and output circuits for inputting or outputting signals to the first and the second input and output circuits; and a corner cell comprising:
- a plurality of wires coupled to the first and the second input and output circuits for exchanging signals between the first and the second input and output circuits;
- a first process monitor circuit formed in the corner cell for monitoring a semiconductor property of the integrated circuit chip; and
- a second probe pad formed in the corner cell and coupled to the first process monitor circuit for inputting or outputting signals to the first process monitor circuit.

2. The integrated circuit chip of claim 1 further comprising a second process monitor circuit outside the corner cell.

3. The integrated circuit chip of claim 2 further comprising a third probe pad coupled to the second process monitor circuit fir inputting or outputting signals to the second process monitor circuit.

4. The integrated circuit chip of claim 3, wherein the third probe pad is formed inside the corner cell.

5. The integrated circuit chip of claim 3, wherein the third probe pad is formed outside the corner cell.

* * * * *